United States Patent [19]

Hashimoto et al.

[11] Patent Number: 5,018,156
[45] Date of Patent: May 21, 1991

[54] SEMICONDUCTOR LASER APPARATUS

[75] Inventors: Masayasu Hashimoto; Hirofumi Yoneyama; Yasuhiro Watanabe, all of Tottori, Japan

[73] Assignee: Sanyo Electric Co., Ltd., Tottori, Japan

[21] Appl. No.: 365,498

[22] Filed: Jun. 13, 1989

[30] Foreign Application Priority Data

Jun. 20, 1988 [JP] Japan .................................. 63-81226
Dec. 29, 1988 [JP] Japan ................................. 63-331549

[51] Int. Cl.$^5$ ................................................. H01S 3/19
[52] U.S. Cl. ...................................................... 372/44
[58] Field of Search ............................ 372/44, 49, 107

[56] References Cited

U.S. PATENT DOCUMENTS 4,803,695 2/1989 Yamamoto et al. .................. 372/29

FOREIGN PATENT DOCUMENTS 3442188A 5/1986 Fed. Rep. of Germany .

Primary Examiner—William L. Sikes
Assistant Examiner—Robert E. Wise
Attorney, Agent, or Firm—Darby & Darby

[57] ABSTRACT

A semiconductor laser apparatus in which a laser emits light from a facet toward a photosensor having a light absorptive surface which is covered by a film having a reflectivity in the range of between about 60% to 90% to reflect light back to the laser with the remainder passing through to the light absorptive surface of the photosensor. The distance between the laser light emitting facet and the reflecting film is in the range of 50 to 150 μm.

13 Claims, 4 Drawing Sheets

SEMICONDUCTOR LASER APPARATUS

BACKGROUND OF THE INVENTION

1. Field of the Invention

The present invention relates to a semiconductor laser apparatus, and more particularly to an external resonator type semiconductor laser apparatus having a reflecting film provided outside a resonator.

2. Description of Related Art

Generally, the characteristic of laser light output from a semiconductor laser depends on its operating temperature. More specifically, the oscillation wavelength and output amplitude of the laser light depends on the temperature. When the ambient temperature changes in a semiconductor laser oscillating at a predetermined wavelength, the oscillation wavelength does not vary proportionally to the temperature change, but becomes longer stepwise following the temperature rise.

In order to reduce such dependency on temperature as referred to above, there has been proposed a distributed feedback type semiconductor laser, or a distributed Bragg reflector type semiconductor laser, having an active layer to produce a diffraction grating effect. Such semiconductor laser, which has a diffraction grating provided directly at the active layer within a laser device, is complicated to manufacture and is difficult to use with some semiconductor materials.

In a typical semiconductor laser, for example, a double hetero-structure type semiconductor laser having an approximately rectilinear active layer and a Fabry-Perot resonator, it has been proposed to add an external resonator type semiconductor laser apparatus having a reflector provided outside the resonator (referring to West German Patent Laid-Open No. DE3442188A1, etc.). Such semiconductor laser apparatus is provided with a reflector outside the resonator opposite to a light emitting facet of the semiconductor laser. In this case, the external reflector is a photodiode coated with a metal film and is located at a distance L from the light emitting facet of the semiconductor laser which is an integral multiple of $\frac{1}{4}$ of the oscillation wavelength $[L = \lambda_e (me + \frac{1}{2}) \cdot \frac{1}{2}]$. Such construction reduces the temperature dependency of the oscillation wavelength and controls the change or fluctuation in the oscillation wavelength as a result of the temperature change because of the cooperative effect of the internal resonance mode and external resonance mode.

It is also known to provide a facet of a photodetector formed by a cleavage, instead of a photodiode with a dielectric film in place of the metal film (referring to U.S. Pat. No. 4,803,695).

However, there are two problems regarding the above. One problem is the balance between the photodetecting properties of a photosensor and the efficiency of the external resonance mode. It is better, when attempting to increase the efficiency of the external resonance mode to increase the reflectivity of the external reflector. However, when the reflectivity is raised, the photodetecting sensitivity of the photodetector, such as a photodiode, is decreased.

In order to stably drive the semiconductor laser, an output of the photosensor is used for providing feedback-control with respect to a driving current for the semiconductor laser. With this arrangement, when the output of the photosensor is small, the change in the optical output cannot be discriminated from noise, or a time lag is caused in the feedback-control, thereby hindering stabilized operation of the semiconductor laser. Also, the reflected light, when intense, is liable to interfere with a far-field pattern which is utilized for communication or information reading of another laser light. As a countermeasure for the above, the reflecting film is provided at a part of the cleavage facet at the photodetector as disclosed in the aforesaid U.S. Pat. No. 4,803,695. However, in this arrangement, it is difficult to position the reflecting film and adjust its angle in order to accurately oppose the same to the light emitting facet of the semiconductor laser.

Another problem with the aforesaid prior art devices is that a thin film is utilized as the reflecting film and, accordingly, the optical characteristic of a support for the reflecting film affects the external resonance mode. In other words in the aforesaid U.S. Pat. No. 4,803,695, wherein a dielectric film is provided at the cleavage facet of a semiconductor photodetector, the reflectivity of the dielectric film is obtained by the cooperative effect of the reflection at the surface of the thin film and the reflection at the interface between the film and the cleavage facet. Further, the reflection within the crystal of the photodetector, is disclosed in Japanese Patent Application Laid-Open No. 229889/1988. Accordingly, in the arrangement of the crystalline structure and external semiconductor chip of GaAs or the like used as the photodetector, it is an important factor to specify the external resonance mode, similarly to positioning of the photodetector with respect to the semiconductor laser. Hence, precise and complicated manufacturing work is required.

SUMMARY OF THE INVENTION

In order to solve the above problem, the present invention has been designed, in which a reflecting film provided on the exterior of a resonator of a semiconductor laser is formed at a photodetecting surface of a photosensor having light absorptivity.

A preferred range for the distance from the resonance surface of the semiconductor laser to the reflecting film of the photosensor is 50 to 150 um, preferably 75 to 130 um.

Such a photosensor as above uses a silicon chip provided with a diffused layer at the surface thereof.

Furthermore, the reflectivity of the reflecting film with respect to the laser light from the semiconductor laser is 60 50 90%, preferably 65 to 80%.

OBJECTS OF THE INVENTION

A primary object of the present invention is to provide a semiconductor laser apparatus which does not require consideration of the crystalline structure of the photosensor with respect to the optical characteristic of the reflecting film.

Another object of the present invention is to provide a semiconductor laser apparatus superior in the balance of the efficiency between the external resonance mode and light responsive output of the photosensor.

Still another object of the present invention is to provide a semiconductor laser apparatus which can stably obtain the external resonance mode with decreased temperature dependency.

A further object of the present invention is to provide a semiconductor laser apparatus wherein a sufficient photodetecting sensitivity can be obtained for carrying out feedback-control with respect to a driving current for the semiconductor laser.

A still further object of the present invention is to provide a semiconductor laser apparatus which does not require forming cleavage facets in a crystal which is a material for the photosensor.

Yet another object of the present invention is to provide a semiconductor laser apparatus in which the positioning of the photosensor with respect to the semiconductor laser is easy to accomplish.

Still a further object of the present invention is to provide a semiconductor laser apparatus which is easy to manufacture.

The above and further objects and features of the invention will more fully be apparent from the following detailed description with accompanying drawings.

DESCRIPTION OF THE PREFERRED EMBODIMENT

A preferred embodiment of a semiconductor laser apparatus of the invention will concretely be described.

Figure 1:
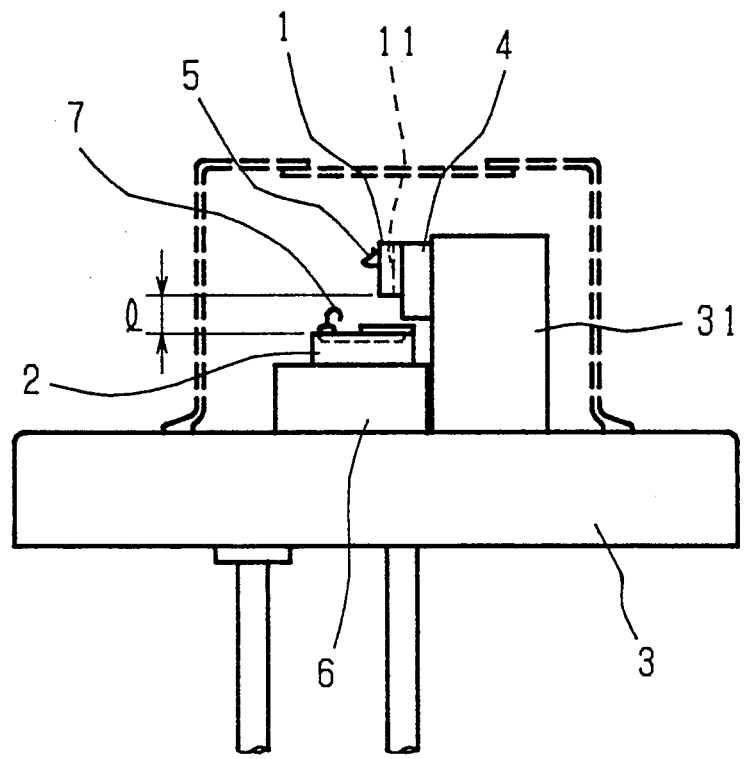
FIG. 1 is a side view of a semiconductor laser apparatus of the invention.

FIG. 1 is a side view of the semiconductor laser apparatus of the invention, from which an enclosure (shown by the broken line in FIG. 1) is removed. In FIG. 1, reference numeral 1 designates a semiconductor laser, for example, of GaAlAs. The laser 1 includes an oscillation layer comprising a rectilinear active layer 11 and cladding layers sandwiching therebetween the active layer 11. A Fabry-Perot resonance surface is formed at opposite ends of the oscillation layer by cleavage facets having reflecting films thereon.

The semiconductor laser 1 is fixed to the side surface of a columnar support member 31 on a base 3 through a submounting base 4 of silicon. The semiconductor laser 1 is mounted upside-down, that is, the facet of the semiconductor laser 1 nearer to the active layer 11 is mounted nearer the sub-mounting base 4. Terminals fixed to the base 3 are connected by wires from the substrate side. Such as by a wire bonding thin wire 5.

Since the semiconductor laser 1 is fixed upside-down, the laser light is more defined in position, and the heat produced by the oscillation of the semiconductor laser 1 is easily dissipated. Moreover the reflected light from a photosensor 2 is prevented from reaching the far-field pattern. Therefore, it is more preferable to fix the semiconductor laser 1 upside-down rather than with the light emitting facet facing away from the base 4.

The semiconductor laser 1 may be a usual semiconductor laser used for an optical recording and reproducing apparatus, a photodocument apparatus, an optical printer and a remote control apparatus except for a particular apparatus such as the aforesaid distributed feedback type apparatus, and also any oscillation longitudinal mode such as multi-mode or single mode may be employed.

The photosensor 2 is fixed to a mounting base 6, which can be a copper block, on the main base 3 and is connected with leads by a wire bonding thin wire 7. The mounting base 6 is provided so as to adjust the height of the photosensor 2, for the purpose of improving the operating efficiency, making the wiring easier and arranging a directional reference surface in positioning of the semiconductor laser 1 with the photosensor 2.

Figure 2:
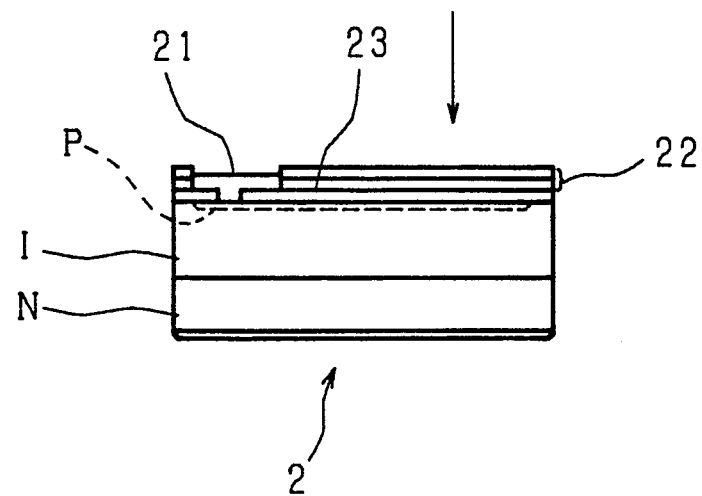
FIG. 2 is a diagram of a photosensor used in the semiconductor laser apparatus of the invention.

The photosensor 2, as shown in FIG. 2, comprises an electrode 21 and a reflecting film 22 provided on the surface of a silicon system crystal of 200 um in a thickness and of the P-I-N type. The P-layer is formed by a boron diffusion in depth of 2 to 10 um from the surface side so that 80 to 95% of the surface of the photosensor 2 is effective to detect the laser light. The reflecting film 22 is provided on the entire surface of the photosensor 2 except for a part where the electrode 21 is formed. Film 22 is formed of two layers, an $Al_2O_3$ film of 1176A in thickness and an amorphous silicon film of 645A in thickness, disposed on a silicon protective film 23. The reflecting film 22 set to have a reflectivity of 70% from the outer surface with respect to light of a wavelength of 770 to 820 nm.

A typical silicon photosensor has a light absorptivity with respect to the light of a wavelength of 770 to 820 nm. The photosensor 2 of the preferred embodiment has at the surface side thereof a larger light absorptivity because of the boron diffused layer, whereby there is no fear that the light leaks from the rear surface or the side surface while the light from the laser is being detected. In addition, if a sufficient area for detecting the laser light is ensured, the reflecting film 22 may be provided in such a manner as to cover a part of the photosensor 2. Also, the material of the photosensor thereof may be indium phosphide 4-element series as well as silicon.

The semiconductor laser 1 and photosensor 2 are disposed opposite to each other so that the surface of the reflecting film 22 and the laser 1 Fabry-Perot resonance surface, which is a lower light emitting facet of the semiconductor laser 1, are spaced only by a predetermined distance $l=100$ $\mu m \pm 50$ $\mu m$ from each other and both the surfaces are parallel to each other. The side surface of the columnar member 31 and the upper surface of the mounting base 6 are processed to have a specified accuracy, so that both the members are correctly positioned. Alternatively, the height and inclination of the mounting base 6 may be specified when it is made so that the semiconductor laser 1 and photosensor 2 may be specifically positioned and mounted with respect only to the columnar member 31 and mounting base 6, thereby correctly positioning both the members. When the electrode 21 is spaced away from the columnar member 31 and the photosensor 2 is positioned such that its reflecting film 22 is positioned below the semiconductor laser 1, and even somewhat under the sub-mounting base 4, the laser light is positively radiated from laser 1 onto the reflecting film 22 of the photosensor 2.

In the present invention, the laser light irrelevant to the laser resonance by reflection from the reflecting film 22 back to the laser passes through the reflecting film and is guided to the photodetecting surface of photosensor 2 at a predetermined ration, and the remainder is reflected by the reflecting film and then reflected or absorbed by the semiconductor laser 1. The laser light incident on the photosensor 2 is never reflected from inside the photosensor 2 due to the absorptivity of the photosensor 2. Accordingly, the laser light not used for the resonance at the reflecting film 22 does not affect the laser light originally emitted from the semiconductor laser 1.

Also, since the reflecting film 22 is provided at the surface of the photosensor 2 which is not a cleavage facet, the cleaving work is not required, thereby facilitating manufacture of the semiconductor laser apparatus. The silicon P-I-N photosensor 2 is superior in light responsive characteristic to GaAs, thereby providing good photodetecting sensitivity. Furthermore, the reflecting film 22 can be provided approximately all over the entire surface of the photosensor 2, making positioning of the photosensor 2 easier.

Figure 3:
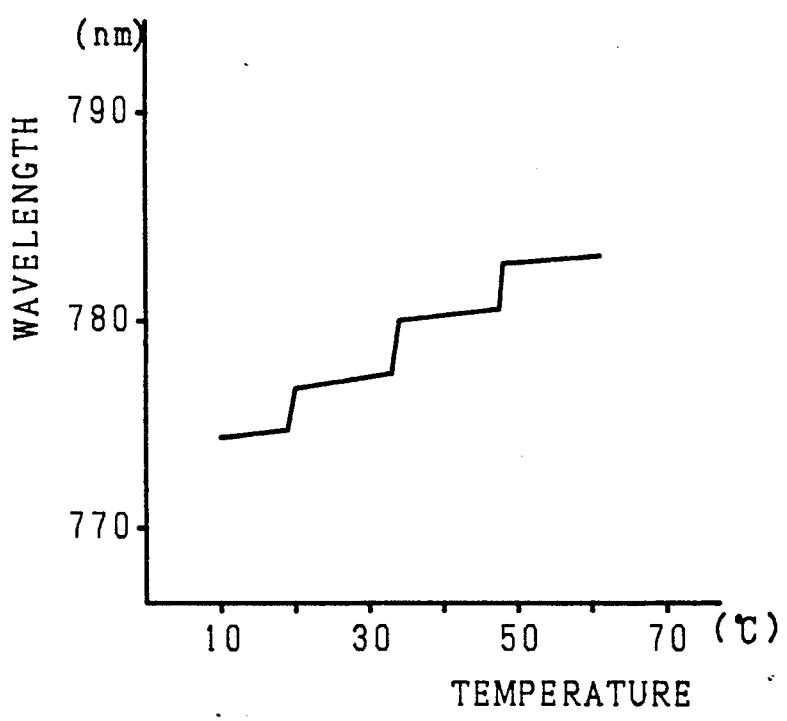
FIG. 3 is a graph showing the temperature characteristic of an oscillation wavelength of the semiconductor laser apparatus of the invention.

Referring to FIG. 3, the temperature characteristic of he oscillation wavelength of the semiconductor laser apparatus of the invention is shown. This shows that the temperature range where the oscillation wavelength of the output laser light is stabilized is from three to five times as wide as in a conventional semiconductor laser.

Figure 4:
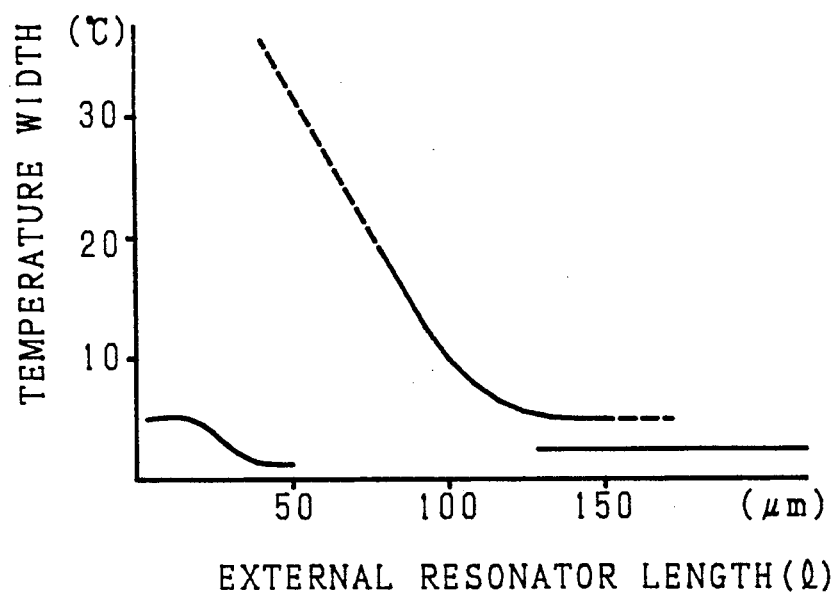
FIG. 4 is a graph showing the relation between the length of an external resonator and a temperature band in which a predetermined oscillation wavelength is maintained.

The predetermined distance (l), in other words, the distance of the external resonator from the laser and the characteristic of the photosensor 2, in the present invention will be detailed as follows:

FIG. 4 is a characteristic diagram of the relation between the distance (external resonator length) (l) and the width of the temperature range in the vicinity of 25° C. for keeping a stabilized oscillation wavelength. For example if the distance (l) is assumed to be 100 μm, a manufactured group of laser will have an average temperature width of 10° C. That is, a laser in a typical example will maintain an oscillation wavelength at 778 nm in the temperature range between 21° C. and 31° C. The resonance effect is decreased as the distance (l) becomes larger, so that a laser showing no external resonance mode for increased temperature stability begins to appear at the distance more than 130 μm. The external resonance mode is not recognized at the distance (l) of more than 150 μm.

The external resonance effect is improved as the distance (l) becomes smaller, and the temperature range over which the wavelength is stabilized becomes larger, but when too small, the central oscillation wavelength is shifted by several μm within the temperature range. In the aspect of manufacturing the semiconductor laser apparatus, the larger the distance (l) is, the easier the wiring and assembly work for the photosensor 2 is, but the parallelism between the photosensor 2 and the semiconductor laser 1 becomes more difficult to be maintained. On the other hand, when the distance (l) becomes smaller, the reverse to the above can be said. Therefore, the distance (l) should be made from about 50 to 150 μm, and more preferably 75 to 130 μm. In case that the distance is within the above range, even when it varies by about ± μm with respect to the predetermined value, the optical output of the laser is not affected.

Figure 5:
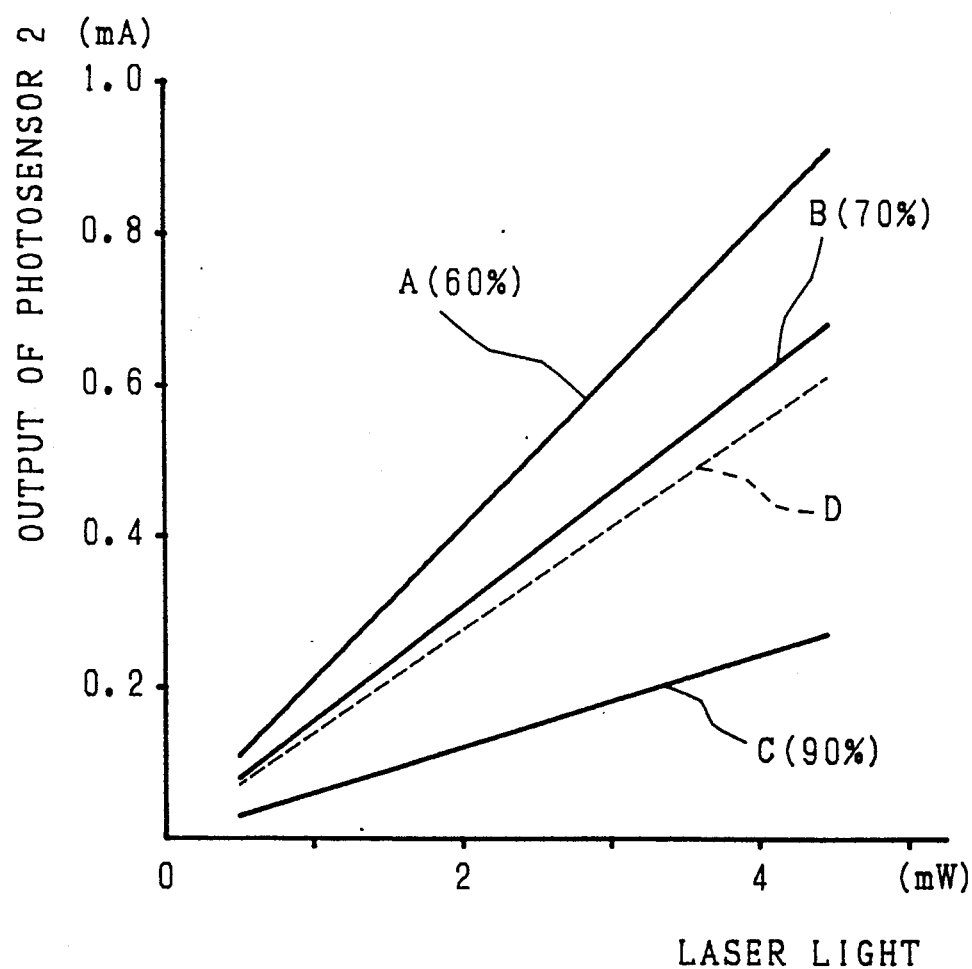
FIG. 5 is a graphical representation of the output of the photosensor used in the semiconductor laser apparatus of the invention.

Referring to FIG. 5, the relation between the reflectivity of the reflecting film 22 of the photosensor 2 and the light responsive output (photocurrent) thereof is shown. As shown in FIG. 5, the lower the reflectivity (numerical value in parentheses in the drawing) is, the larger the light responsive output becomes. However, when the reflectivity becomes too low, the external resonance effect is eliminated because not enough light is reflected back to the laser. Contrary to the above, when the reflectivity is too high, the light responsive output is reduced, so that the signal-noise ratio is deteriorated, whereby a minute change of the output of the semiconductor laser 1 cannot be responded to. Hence, it is preferable that the reflectivity is set between 60% (characteristic A) and 90% (characteristic C). The light responsive characteristic (characteristic D) of a silicon photosensor having non-reflective coating when the laser light only is monitored at a standard resonator distance.

The reflecting film 22 is, when its reflectivity is raised, deteriorates in quality. Also, when the reflectivity of the reflecting film 22 approaches 50%, the external resonance effect with less laser light output becomes dependent on the oscillation wavelength. In order to prevent such state, it is preferable to keep the reflectivity of the reflecting film 22 over 65% and less than 80%.

The semiconductor laser apparatus of the present invention can obtain, in properly balanced state, the external resonance mode superior in the wavelength stability and the optical output of the photosensor, by so deciding the numerical values as mentioned hereinabove.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A semiconductor laser apparatus comprising:
   a semiconductor laser having a pair of opposed light emitting surfaces; and
   a semiconductor photosensor separated by a predetermined distance from a light emitting surface of said semiconductor laser, said semiconductor photosensor having a layer with main inner and outer surfaces and a side and a semiconductor junction surface beneath and coextensive with a substantial part of said layer main inner surface a film formed over a substantial part of said layer main outer surface, said layer main outer surface positioned opposite one of the light emitting surfaces of said laser, said film reflecting a portion of the laser emitted light from the laser light emitting surface back to the laser while permitting some of the light to pass to said semiconductor junction surface for photodetection.

2. A semiconductor laser apparatus according to claim 1, wherein said semiconductor laser comprises GaAlAs and a Fabry-Perot resonator.

3. A semiconductor laser apparatus according to claim 1 further comprising a member for fixing said semiconductor laser upside-down.

4. A semiconductor laser apparatus according to claim 1, wherein said predetermined distance is over 50 μm and less than 150 μm.

5. A semiconductor laser apparatus according to claim 4, wherein said predetermined distance is over 75 μm and less than 130 μm.

6. A semiconductor laser apparatus according to claim 1, wherein said photosensor comprises a silicon chip and the light absorbing material of the photodetecting surface is a diffused layer provided at a chip surface.

7. A semiconductor laser apparatus according to claim 1, wherein said reflecting film is provided over substantially the entire photodetecting surface of said photosensor.

8. A semiconductor laser apparatus according to claim 1, wherein the reflectivity of said reflecting film with respect to the laser light from said semiconductor laser is 60 to 90%.

9. A semiconductor laser apparatus according to claim 8, wherein the reflectivity of said reflecting film with respect to the laser light from said semiconductor laser is 65 to 80%.

10. A semiconductor laser apparatus according to claim 9, wherein said reflecting film is provided over substantially the entire photodetecting surface of said photosensor.

11. A semiconductor laser apparatus according to claim 8, wherein said reflecting film is provided over substantially the entire photodetecting surface of said photosensor.

12. A semiconductor laser apparatus as in claim 1, wherein said photodetecting surface is the planar layer of a silicon chip.

13. A semiconductor laser apparatus as in claim 1 further comprising means for applying the output of the semiconductor photosensor to said semiconductor laser as a feedback control.

* * * * *

UNITED STATES PATENT AND TRADEMARK OFFICE
CERTIFICATE OF CORRECTION

PATENT NO. : 5,018,156
DATED : May 21, 1991
INVENTOR(S) : Masayasu Hashimoto et al It is certified that error appears in the above-identified patent and that said Letters Patent is hereby corrected as shown below:

On the title page, after "[73]"; delete "Sanyo Electric Co., Ltd., Tottori, Japan" and substitute therefor --Sanyo Electric Co., Ltd., Osaka and Tottori Sanyo Electric Co., Ltd., Tottori, both of Japan--.

Signed and Sealed this

Nineteenth Day of January, 1993

*Attest:*

DOUGLAS B. COMER

*Attesting Officer*  Acting Commissioner of Patents and Trademarks